(12) United States Patent
Otsuki et al.

(10) Patent No.: US 7,189,598 B2
(45) Date of Patent: Mar. 13, 2007

(54) WIRING BOARD, METHOD OF MANUFACTURING THE SAME, SEMICONDUCTOR DEVICE, AND ELECTRONIC INSTRUMENT

(75) Inventors: Tetsuya Otsuki, Fujimi-machi (JP); Hirofumi Kurosawa, Tutsuno-machi (JP); Hiroshi Miki, Fujimi-machi (JP)

(73) Assignee: Seiko Epson Corporation (JP)

( * ) Notice: Subject to any disclaimer, the term of this patent is extended or adjusted under 35 U.S.C. 154(b) by 148 days.

(21) Appl. No.: 10/792,266

(22) Filed: Mar. 2, 2004

(65) Prior Publication Data

US 2004/0241903 A1 Dec. 2, 2004

(30) Foreign Application Priority Data

Mar. 3, 2003 (JP) .............................. 2003-055641
Mar. 3, 2003 (JP) .............................. 2003-055642

(51) Int. Cl.
*H01L 21/44* (2006.01)

(52) U.S. Cl. .................. 438/119; 438/125; 29/830; 29/846; 428/473.5; 428/425.9; 361/751; 361/760; 361/783

(58) Field of Classification Search ............... 438/106, 438/119
See application file for complete search history.

(56) References Cited

U.S. PATENT DOCUMENTS 5,746,868 A * 5/1998 Abe ........................... 156/247

6,329,610 B1 * 12/2001 Takubo et al. ............... 174/264
6,378,199 B1 * 4/2002 Yoshinuma et al. .......... 29/830
6,409,866 B1 * 6/2002 Yamada ....................... 156/219
2003/0157272 A1 8/2003 Tonai et al

FOREIGN PATENT DOCUMENTS

| JP | 10-013019 | 1/1998 |
| JP | 2002-064278 | 2/2002 |
| JP | 2002-324966 | 11/2002 |
| JP | 2002-353597 | 12/2002 |
| JP | 2003-229653 | 8/2003 |
| JP | 2003-253455 | 9/2003 |
| JP | 2003-264361 | 9/2003 |
| WO | WO 01/84610 | 11/2001 |

OTHER PUBLICATIONS

Communication from Japanese Patent Office regarding related application.
Communication from Japanese Patent Office re: related application.

* cited by examiner

*Primary Examiner*—Carl Whitehead, Jr.
*Assistant Examiner*—Colleen E. Rodgers
(74) *Attorney, Agent, or Firm*—Harness, Dickey & Pierce, P.L.C.

(57) ABSTRACT

A receiving layer is formed from a thermosetting resin precursor. An interconnecting layer is formed on the receiving layer from a dispersion liquid containing conductive particles. Heat is applied to the receiving layer and the interconnecting layer to cure the thermosetting resin precursor and to bond the conductive particles together.

2 Claims, 12 Drawing Sheets

WIRING BOARD, METHOD OF MANUFACTURING THE SAME, SEMICONDUCTOR DEVICE, AND ELECTRONIC INSTRUMENT

Japanese Patent Application No. 2003-55641, filed on Mar. 3, 2003, and Japanese Patent Application No. 2003-55642, filed on Mar. 3, 2003, are hereby incorporated by reference in their entirety.

BACKGROUND OF THE INVENTION

The present invention relates to a wiring board, a method of manufacturing the same, a semiconductor device, and an electronic instrument.

Conventionally, a printed wiring board is manufactured by attaching copper foil to, a base material and forming interconnecting lines by etching. This complicates the process and makes it necessary to use an expensive mask for etching. Moreover, a number of pieces of equipment is necessary. A polyimide is generally used as the base material. However, since adhesion between the polyimides is low, it is difficult to manufacture a multilayer substrate.

In recent years, a technology of forming interconnecting lines by ejecting metallic ink onto a surface-treated base material has been developed. In the case of controlling the surface tension of the metallic ink by forming a fluorine film on the base material {fluoroalkylsilane (FAS) treatment} and making the fluorine film porous as the surface treatment, it is difficult to increase adhesion between the interconnecting lines and the base material. Therefore, interlayer separation easily occurs after stacking the base materials, whereby it is difficult to manufacture a highly reliable multilayer substrate. Moreover, since the fluorine films cannot be stacked, a multilayer structure may not be obtained.

As the surface treatment, a method of forming a receiving layer having swelling properties by applying a polyvinyl alcohol to the base material, or a method of forming a (porous) receiving layer having voids by applying aluminum hydroxide to the base material may be employed. However, since the receiving layer tends to contain moisture due to high hygroscopicity, the receiving layer is not suitable as an inner layer or an inner layer of the multilayer substrate. Moreover, it is difficult to increase adhesion between the interconnecting lines and the base material. Since it is difficult to increase adhesion between the interconnecting lines and the base material, interlayer separation easily occurs after stacking the base materials. Therefore, it is difficult to manufacture a highly reliable multilayer substrate.

BRIEF SUMMARY OF THE INVENTION

According to one aspect of the present invention, there is provided a method of manufacturing a wiring board, comprising:

forming a receiving layer from a thermosetting resin precursor;

forming an interconnecting layer on the receiving layer from a dispersion liquid containing conductive particles; and applying heat to the receiving layer and the interconnecting layer to cure the thermosetting resin precursor and to bond the conductive particles together.

According to another aspect of the present invention, there is provided a method of manufacturing a wiring board, comprising:

forming a first receiving layer from a thermosetting resin precursor;

forming a first interconnecting layer on the first receiving layer from a dispersion liquid containing conductive particles;

forming a second receiving layer on the first receiving layer and the first interconnecting layer from a thermosetting resin precursor;

forming a second interconnecting layer on the second receiving layer from a dispersion liquid containing conductive particles; and applying heat to cure the thermosetting resin precursors of the first and second receiving layers and to bond the conductive particles of the first and second interconnecting layers together at a connecting portion of the first and second interconnecting layers.

A wiring board according to a further aspect of the present invention is manufactured by any of the above methods.

A semiconductor device according to still another aspect of the present invention comprises the above wiring board and a semiconductor chip electrically connected to the wiring board.

An electronic instrument according to yet another aspect of the present invention comprises the above semiconductor device.

DETAILED DESCRIPTION OF THE EMBODIMENTS

Figure 1A:
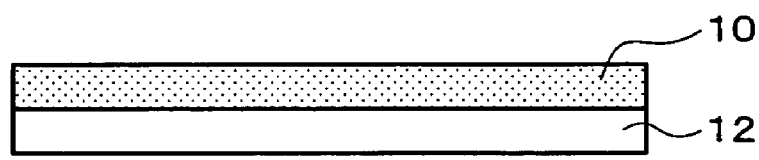
FIGS. 1A to 1D are illustrative of a method of manufacturing a wiring board according to a first embodiment of the present invention.

An objective of the embodiments of the present invention is to simply manufacture a highly reliable wiring board.

(1) According to one embodiment of the present invention, there is provided a method of manufacturing a wiring board, comprising:

forming a receiving layer from a thermosetting resin precursor;

forming an interconnecting layer on the receiving layer from a dispersion liquid containing conductive particles; and applying heat to the receiving layer and the interconnecting layer to cure the thermosetting resin precursor and to bond the conductive particles together.

According to this method of manufacturing a wiring board, since the receiving layer is in an uncured state when providing the dispersion liquid containing the conductive particles, occurrence of blurring or bulging can be reduced. Moreover, adhesion between the heat-cured receiving layer and the interconnecting layer including the bonded conductive particles is high. Therefore, a highly reliable wiring board can be easily manufactured.

(2) In this method of manufacturing a wiring board, a polyimide precursor may be used as the thermosetting resin precursor and polymerized by the heat.

(3) In this method of manufacturing a wiring board, the interconnecting layer may be formed by ejecting the dispersion liquid containing the conductive particles.

(4) In this method of manufacturing a wiring board, the receiving layer may be formed on a base material.

(5) This method of manufacturing a wiring board may further comprise: removing the base material from the receiving layer after curing of the thermosetting resin precursor and bonding of the conductive particles.

(6) A wiring board according to one embodiment of the present invention is manufactured by the above method.

(7) A semiconductor device according to one embodiment of the present invention comprises the above wiring board and a semiconductor chip electrically connected to the wiring board.

(8) An electronic instrument according to one embodiment of the present invention comprises the above semiconductor device.

(9) According to one embodiment of the present invention, there is provided a method of manufacturing a wiring board, comprising:

forming a first receiving layer from a thermosetting resin precursor;

forming a first interconnecting layer on the first receiving layer from a dispersion liquid containing conductive particles;

forming a second receiving layer on the first receiving layer and the first interconnecting layer from a thermosetting resin precursor;

forming a second interconnecting layer on the second receiving layer from a dispersion liquid containing conductive particles; and applying heat to cure the thermosetting resin precursors of the first and second receiving layers and to bond the conductive particles of the first and second interconnecting layers together at a connecting portion of the first and second interconnecting layers.

According to this method of manufacturing a wiring board, since the first receiving layer is in an uncured state when providing the dispersion liquid containing the conductive particles, occurrence of blurring or bulging can be reduced. Moreover, since the first and second receiving layers mutually react when being heat-cured, interlayer separation does not occur or rarely occurs. Furthermore, adhesion between the heat-cured first or second receiving layer and the first or second interconnecting layer including the bonded conductive particles is high. Therefore, a highly reliable wiring board can be easily manufactured.

(10) This method of manufacturing a wiring board may further comprise: heating the first interconnecting layer before forming the second receiving layer, at a temperature lower than a temperature at which the thermosetting resin precursor of the first receiving layer is cured.

(11) In this method of manufacturing a wiring board, the conductive particles may be dispersed in a dispersion medium and covered by a coating material to reduce mutual reaction of the conductive particles; and the coating material may be decomposed in the heating step before forming the second receiving layer.

(12) In this method of manufacturing a wiring board, the thermosetting resin precursor of the second receiving layer may have photosensitivity before being cured; and the second receiving layer may be patterned by using photosensitivity before curing by the heat.

(13) In this method of manufacturing a wiring board, a polyimide precursor may be used as the thermosetting resin precursor and polymerized by the heat.

(14) In this method of manufacturing a wiring board, the first and second interconnecting layers may be formed by ejecting the dispersion liquid containing the conductive particles.

(15) In this method of manufacturing a wiring board, the first receiving layer may be formed on a base material.

(16) This method of manufacturing a wiring board may further comprise:

removing the base material from the first receiving layer after curing the thermosetting resin precursors of the first and second receiving layers and bonding of the conductive particles of the first and second interconnecting layers at a connecting portion of the first and second interconnecting layers.

(17) According to one embodiment of the present invention, there is provided a wiring board manufactured by any of the above methods described in (9) to (16).

(18) A semiconductor device according to one embodiment of the present invention comprises the above wiring board described in (17) and a semiconductor chip electrically connected to the wiring board.

(19) An electronic instrument according to one embodiment of the present invention comprises the above semiconductor device described in. (18).

The embodiments of the present invention are described below with reference to the drawings.

First Embodiment

FIGS. 1A to 3C are illustrative of a method of manufacturing a wiring board according to a first embodiment of the present invention. In the present embodiment, a receiving layer 10 is formed by using a thermosetting resin precursor (organic material such as a polyimide precursor or an epoxy resin precursor, for example), as shown in FIG. 1A. The thermosetting resin precursor may be a liquid or paste before being heat-cured. The receiving layer 10 may have viscosity. The material for forming the receiving layer 10 may exhibit photosensitivity. The receiving layer 10 may be formed by spreading the thermosetting resin precursor by spin coating, or may be formed by ejecting the thermosetting resin precursor (ejecting droplets of the thermosetting resin precursor, for example). The receiving layer 10 may be dried (at 150° C. for 10 minutes, for example), if necessary. The receiving layer 10 may be formed to have a flat surface. The receiving layer 10 has insulating properties and may be called a (first) insulating layer.

The receiving layer 10 may be formed on a base material 12 (substrate, for example). The base material 12 may be formed of a metal such as copper, a resin such as a polyimide or epoxy, or glass.

Figure 1B:
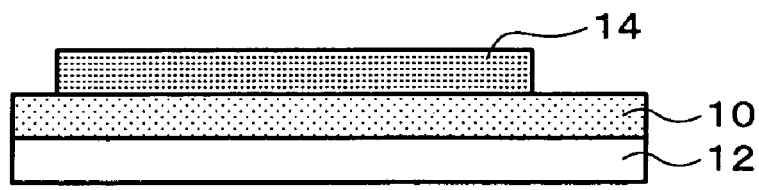

As shown in FIG. 1B, an interconnecting layer 14 (hereinafter may be called "first interconnecting layer") is formed on the receiving layer 10. The interconnecting layer 14 is formed by using a dispersion liquid containing conductive particles (metallic ink, for example). The conductive particles may be formed of a material which is rarely oxidized and has a low electrical resistance, such as gold or silver. As a dispersion liquid containing gold particles, "Perfect Gold" (manufactured by Vacuum Metallurgical Co., Ltd.) may be used. As a dispersion liquid containing silver particles, "Perfect Silver" (manufactured by Vacuum Metallurgical Co., Ltd.) may be used. There are no specific limitations to the size of the particles. The particles used herein refer to particles which can be ejected together with the dispersion medium. The interconnecting layer 14 may be formed by ejecting a dispersion liquid containing the conductive particles using an ink-jet method or a Bubble Jet (registered trademark) method, or may be formed by mask printing or screen printing. The conductive particles may be covered with a coating material in order to prevent a reaction between the particles. The dispersion medium may be dried to only a small extent and have resolubility. The conductive particles may be uniformly dispersed in the dispersion medium.

According to the present embodiment, since the dispersion liquid containing conductive particles is provided on the thermosetting resin precursor, occurrence of blurring or bulging can be prevented when forming the interconnecting layer 14. The conductive particles (or conductive particles and coating material) may be allowed to remain by drying the interconnecting layer 14 to volatilize the dispersion medium. The interconnecting layer 14 may be dried at a temperature from room temperature or more to 100° C. or less. The interconnecting layer 14 may be heated at a temperature at which the thermosetting resin precursor which makes up the receiving layer 10 is not cured (about 200° C., for example). The coating material which covers the conductive particles may be decomposed by this heating.

Figure 1C:
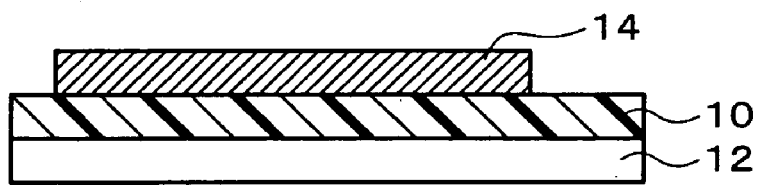

As shown in FIG. 1C, heat is applied to the receiving layer 10 and the interconnecting layer 14. The receiving layer 10 and the interconnecting layer 14 may be heated at a temperature at which the thermosetting resin precursor which makes up the receiving layer 10 is cured (polymerized, for example) (about 300 to 400° C., for example). The receiving layer 10 and the interconnecting layer 14 may be heated at a temperature at which the conductive particles of the interconnecting layer 14 are bonded (sintered, for example) (about 300 to 600° C., for example). The heat may be applied for about one hour. This causes the thermosetting resin precursor to become an insoluble and infusible resin (thermosetting resin). For example, a polyimide precursor becomes a polyimide and an epoxy resin precursor becomes an epoxy resin. The conductive particles form a conductive film or a conductive layer. After the thermosetting resin precursor is cured and the conductive particles are bonded, adhesion between the receiving layer 10 and the interconnecting layer 14 is increased, whereby a highly reliable wiring board can be obtained.

Figure 1D:
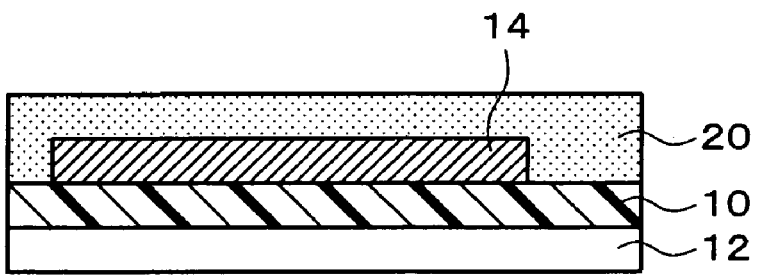

As shown in FIG. 1D, an insulating layer 20 (hereinafter may be called "second insulating layer") may be formed to cover the interconnecting layer 14. The description of the receiving layer 10 may be applied to the material and the formation method for the insulating layer 20. The insulating layer 20 may exhibit photosensitivity. In the case of forming the insulating layer 20, the dispersion medium is volatilized from at least the interconnecting layer 14 before forming the insulating layer 20. In the present embodiment, the insulating layer 20 is formed after causing the conductive particles of the interconnecting layer 14 to be bonded (sintered, for example).

Figure 2A:
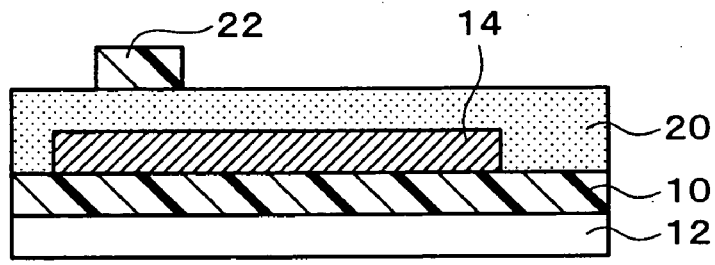
FIGS. 2A to 2D are illustrative of a method of manufacturing a wiring board according to the first embodiment of the present invention.

As shown in FIG. 2A, a mask layer 22 may be formed on the insulating layer 20. The mask layer 22 is formed to correspond to a contact hole 24 to be formed in the insulating layer 20. In the case of forming the insulating layer 20 by using a material which is cured by applying light (ultraviolet radiation, for example), the mask layer 22 is formed at the formation position of the contact hole 24. The mask layer 22 may be formed by ejecting resin or printing.

Figure 2B:
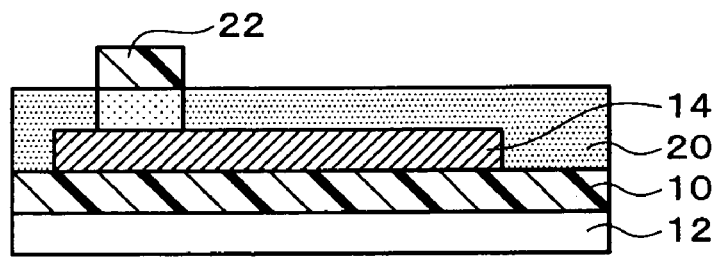
Figure 2C:
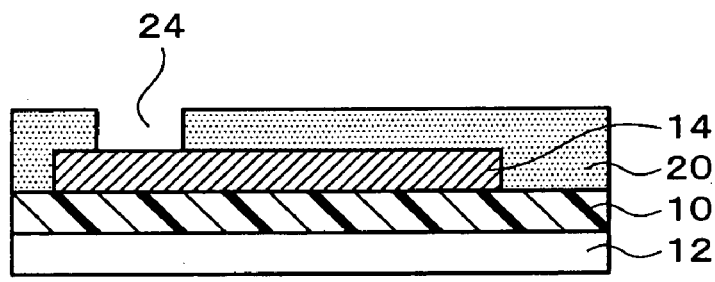

As shown in FIG. 2B, the insulating layer 20 is cured in the area exposed from the mask layer 22 by applying light (ultraviolet radiation, for example) to the insulating layer 20. In this case, the insulating layer 20 is cured to such an extent to allow development, but the curing reaction (polymerization or crosslinking reaction) is not completed (state in which the insulating layer 20 has viscosity). As shown in FIG. 2C, the contact hole 24 is formed in the insulating layer 20 by development.

Figure 2D:
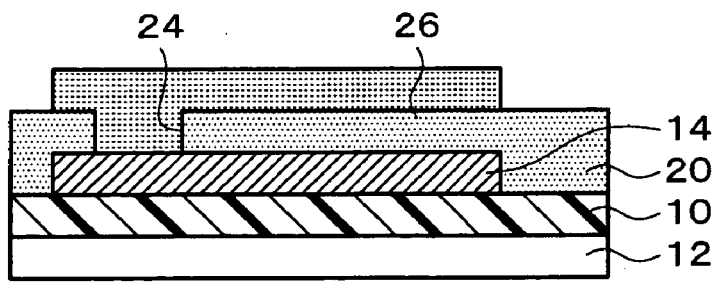

As shown in FIG. 2D, a second interconnecting layer 26 is formed on the insulating layer 20. The description of the first interconnecting layer 14 may be applied to the material and the formation method for the second interconnecting layer 26. Since the insulating layer 20 has the same function as the receiving layer 10 for the second interconnecting layer 26, the insulating layer 20 may be called a receiving layer. The second interconnecting layer 26 is formed to come in contact with the first interconnecting layer 14 through the contact hole 24. In the case of forming the second interconnecting layer 26 by using a dispersion liquid containing conductive particles, the dispersion liquid may be ejected into the contact hole 24.

Figure 3A:
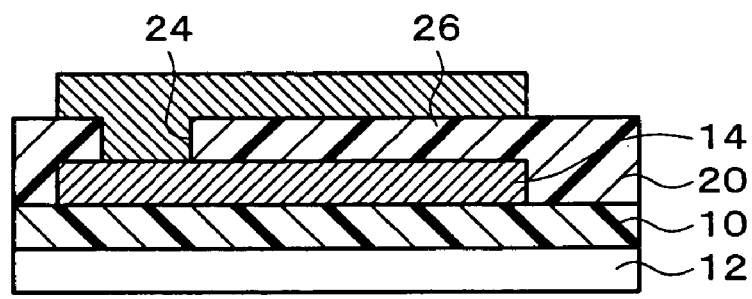
FIGS. 3A to 3C are illustrative of a method of manufacturing a wiring board according to the first embodiment of the present invention.

As shown in FIG. 3A, the material which makes up the insulating layer 20 may be cured and the conductive particles in the second interconnecting layer 26 may be bonded by applying heat. The insulating layer 20 and the second interconnecting layer 26 may have the features described for the receiving layer 10 and the first interconnecting layer 14, and achieve the same effects.

Figure 3B:
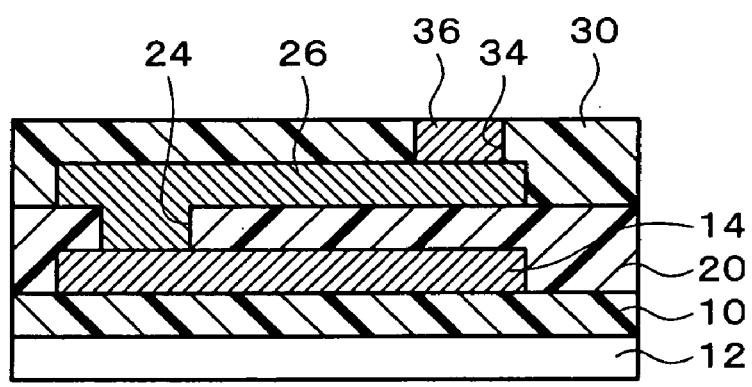

As shown in FIG. 3B, a third insulating layer 30 may be formed to cover the second interconnecting layer 26. The description of the insulating layer 20 may be applied to the material and the formation method for the third insulating layer 30. A contact hole 34 may be formed in the third insulating layer 30, and a contact post 36 may be formed on the second interconnecting layer 26.

Figure 3C:
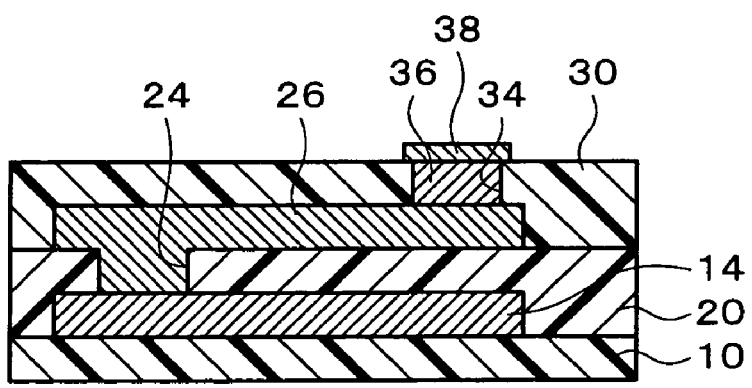

As shown in FIG. 3C, a terminal section 38 may be formed on the contact post 36. The terminal section 38 may be formed to be larger than the upper surface of the contact post 36. In this case, the peripheral section of the terminal section 38 may be placed on the third insulating layer 30.

The terminal section 38 may be formed by electroless plating of Ni, Cu, or the like.

As shown in FIG. 3C, the base material 12 may be removed from the receiving layer 10. For example, a copper plate may be used as the base material 12, and the base material 12 may be dissolved by immersing the base material 12 in an etchant such as ferric chloride. This step is performed after causing the thermosetting resin precursor (receiving layer 10 and the second and third insulating layers 20 and 30) to be cured and the conductive particles (first and second interconnecting layers 14 and 26) to be bonded. This enables a thin multilayered wiring board to be obtained.

According to the present embodiment, the heat-cured receiving layer 10 has high adhesion to the interconnecting layer 14 including the bonded conductive particles. Therefore, a highly reliable wiring board can be easily manufactured.

Second Embodiment

Figure 4A:
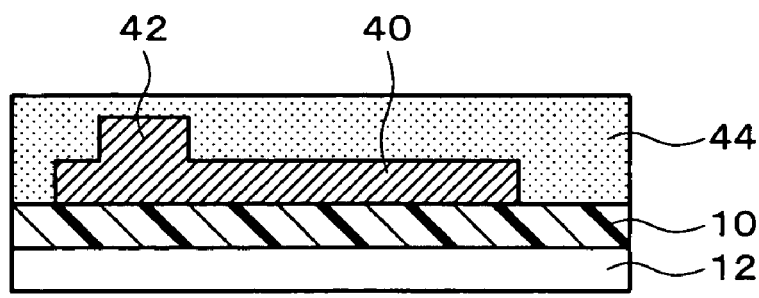
FIGS. 4A to 4C are illustrative of a method of manufacturing a wiring board according to a second embodiment of the present invention.
Figure 4B:
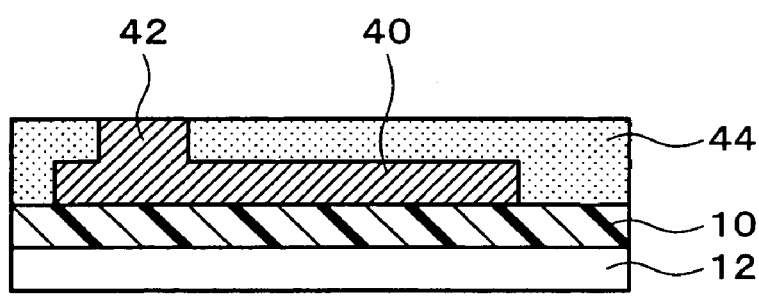
Figure 4C:
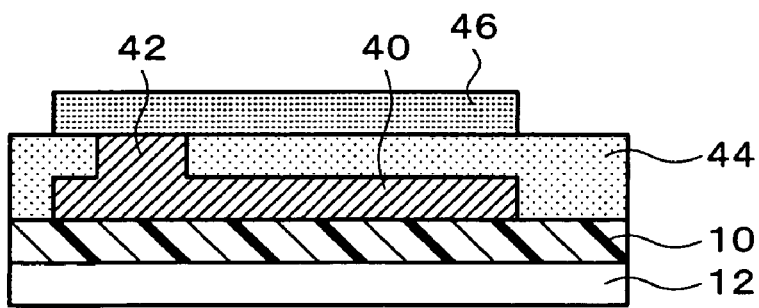

FIGS. 4A to 4C are illustrative of a method of manufacturing a wiring board according to a second embodiment of the present invention. In the present embodiment, an interconnecting layer 40 is formed on the receiving layer 10. The base material 12 may be used. The description of the first embodiment may be applied to the material and the formation method for the receiving layer 10 and the interconnecting layer 40. The interconnecting layer 40 is formed to include a contact post 42. An insulating layer 44 is formed to cover the interconnecting layer 40. The insulating layer 44 may cover the contact post 42. The description of the insulating layer 20 in the first embodiment may be applied to the material and the formation method for the insulating layer 44. In the present embodiment, the insulating layer 44 is formed after causing the receiving layer 10 to be heat-cured and the conductive particles in the interconnecting layer 40 to be bonded.

As shown in FIG. 4B, at least the upper surface of the contact post 42 is exposed from the insulating layer 44. The surface of the insulating layer 44 may be removed so that the insulating layer 44 becomes thinner. The surface of the insulating layer 44 may be dissolved.

As shown in FIG. 4C, a second interconnecting layer 46 is formed on the insulating layer 44. The description of the second interconnecting layer 26 in the first embodiment may be applied to the material and the formation method for the second interconnecting layer 46. Since the insulating layer 44 has the same function as the receiving layer 10 for the second interconnecting layer 46, the insulating layer 44 may be called a receiving layer. The second interconnecting layer 46 is formed to pass over the contact post 42. The conductive particles in the second interconnecting layer 46 are bonded, whereby a multilayered wiring board can be manufactured. The description of the first embodiment may be applied to the present embodiment. In the present embodiment, the effects described in the first embodiment can also be achieved.

Third Embodiment

Figure 5A:
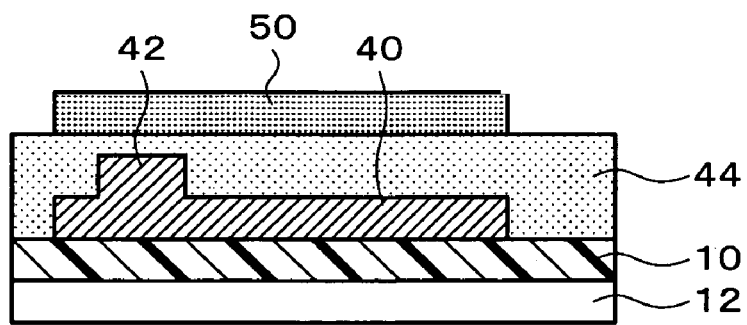
FIGS. 5A and 5B are illustrative of a method of manufacturing a wiring board according to a third embodiment of the present invention.
Figure 5B:
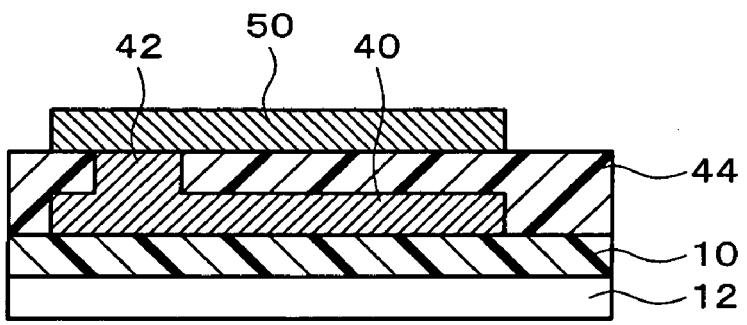

FIGS. 5A and 5B are illustrative of a wiring board according to a third embodiment of the present invention. In the present embodiment, the interconnecting layer 40 is formed on the receiving layer 10, and the insulating layer 44 is formed on the interconnecting layer 40 in the same manner as described in the second embodiment. The insulating layer 44 is formed to cover the contact post 42. The other details are the same as the details described with reference to FIG. 4A.

As shown in FIG. 5A, a second interconnecting layer 50 is formed on the insulating layer 44 before heat-curing the thermosetting resin precursor which makes up the insulating layer 44. The description of the second interconnecting layer 26 in the first embodiment may be applied to the material and the formation method for the second interconnecting layer 50. Since the insulating layer 44 has the same function as the receiving layer 10 for the second interconnecting layer 50, the insulating layer 44 may be called a receiving layer. A part of the insulating layer 44 is present between the second interconnecting layer 50 and the contact post 42.

As shown in FIG. 5B, the insulating layer 44 is heat-cured, and the conductive particles in the second interconnecting layer 50 are bonded. The insulating layer 44 is removed from the space between the contact post 42 and the second interconnecting layer 50 by causing the insulating layer 44 to shrink during heat-curing (polymerization). The contact post 42 is electrically connected with the second interconnecting layer 50. A multilayered wiring board can be manufactured in this manner. The description of the first embodiment may be applied to the present embodiment. In the present embodiment, the effects described in the first embodiment can also be achieved.

Fourth Embodiment

Figure 6A:
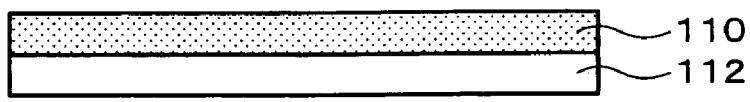
FIGS. 6A to 6D are illustrative of a method of manufacturing a wiring board according to a fourth embodiment of the present invention.

FIGS. 6A to 9C are views illustrating a method of manufacturing a wiring board (multilayered wiring board) according to a fourth embodiment of the present invention. In the present embodiment, a first receiving layer 110 is formed by using a thermosetting resin precursor (organic material such as a polyimide precursor or an epoxy resin precursor, for example), as shown in FIG. 6A. The thermosetting resin precursor may be a liquid or paste before being heat-cured. The first receiving layer 110 may have viscosity. The material for forming the first receiving layer 110 may exhibit photosensitivity. The first receiving layer 110 may be formed by spreading the thermosetting resin precursor by spin coating, or may be formed by ejecting the thermosetting resin precursor (ejecting droplets of the thermosetting resin precursor, for example). The first receiving layer 110 may be dried (at 150° C. for 10 minutes, for example), if necessary. The first receiving layer 110 may be formed to have a flat surface. The first receiving layer 110 has insulating properties and may be called a first insulating layer.

The first receiving layer 110 may be formed on a base material 112 (substrate, for example). The base material 112 may be formed of a metal such as copper, a resin such as a polyimide or epoxy, or glass.

Figure 6B:
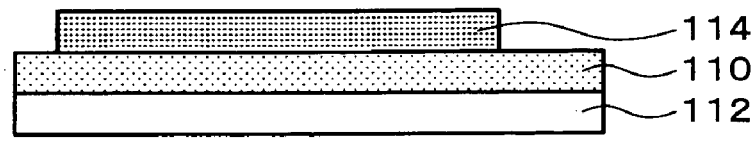

As shown in FIG. 6B, a first interconnecting layer 114 is formed on the first receiving layer 110. The first interconnecting layer 114 is formed by using a dispersion liquid containing conductive particles (metallic ink, for example). The conductive particles may be formed of a material which is rarely oxidized and has a low electrical resistance, such as gold or silver. As a dispersion liquid containing gold particles, "Perfect Gold" (manufactured by Vacuum Metallurgical Co., Ltd.) may be used. As a dispersion liquid containing silver particles, "Perfect Silver" (manufactured by Vacuum Metallurgical Co., Ltd.) may be used. There are no specific limitations to the size of the particles. The particles used herein are particles which can be ejected together with a dispersion liquid. The first interconnecting layer 114 may be formed by ejecting a dispersion liquid containing conductive particles using an ink-jet method or a Bubble Jet (registered trademark) method, or may be formed by mask printing or screen printing. The conductive particles may be covered with a coating material in order to prevent a reaction between the particles. The dispersion medium may be dried to only a small extent and have resolubility. The conductive particles may be uniformly dispersed in a dispersion medium.

According to the present embodiment, since the dispersion liquid containing conductive particles is provided on the thermosetting resin precursor, occurrence of blurring or bulging can be prevented when forming the first interconnecting layer 114. The conductive particles (or conductive particles and coating material) may be allowed to remain by drying the first interconnecting layer 114 to volatilize the dispersion medium. The first interconnecting layer 114 may be dried at a temperature from room temperature or more to 100° C. or less.

Figure 6C:
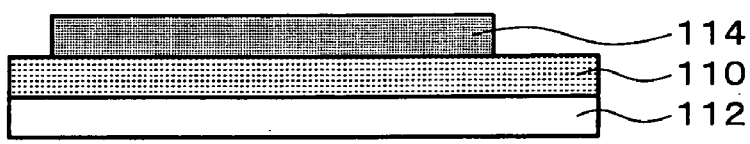

As shown in FIG. 6C, the first interconnecting layer 114 may be heated at a temperature lower than the temperature at which the thermosetting resin precursor which makes up the first receiving layer 110 is heat-cured (about 200° C., for example). The coating material which covers the conductive particles may be decomposed by heating. A gas may be generated when decomposing the coating material.

Figure 6D:
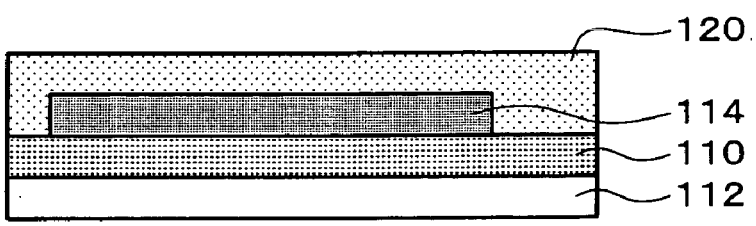

As shown in FIG. 6D, a second receiving layer 120 is formed on the first interconnecting layer 114 and the first receiving layer 110. The second receiving layer 120 is formed by using a thermosetting resin precursor. The description of the first receiving layer 110 may be applied to the material and the formation method for the second receiving layer 120. The second receiving layer 120 may exhibit photosensitivity before being cured. The second receiving layer 120 has insulating properties and may be called a second insulating layer.

Figure 7A:
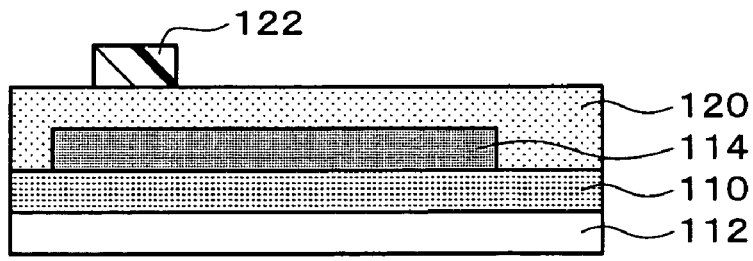
FIGS. 7A to 7D are illustrative of a method of manufacturing a wiring board according to the fourth embodiment of the present invention.

As shown in FIG. 7A, a mask layer 122 may be formed on the second receiving layer 120. The mask layer 122 is formed to correspond to a contact hole 124 to be formed in the second receiving layer 120. In the case of forming the second receiving layer 120 by using a material which is cured by applying light (ultraviolet radiation, for example), the mask layer 122 is formed at the formation position of the contact hole 124. The mask layer 122 may be formed by ejecting resin or printing.

Figure 7B:
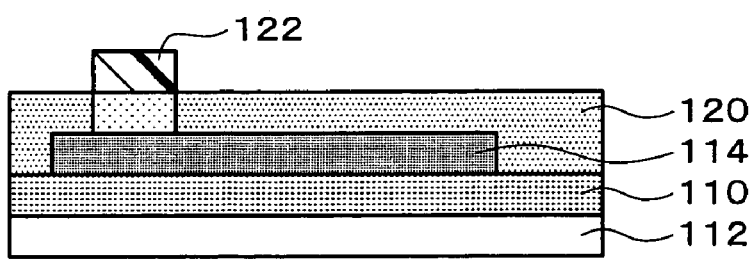
Figure 7C:
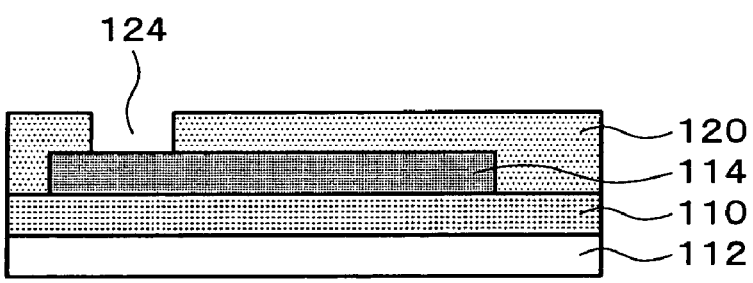

As shown in FIG. 7B, the second receiving layer 120 is cured in the area exposed from the mask layer 122 by applying light (ultraviolet radiation, for example) to the second receiving layer 120. In this case, the second receiving layer 120 is cured to such an extent to allow development, but the curing reaction (polymerization or crosslinking reaction) is not completed (state in which the second receiving layer 120 has viscosity). As shown in FIG. 7C, the contact hole 124 is formed in the second receiving layer 120 by development. The second receiving layer 120 may be patterned in this manner. The second receiving layer 120 may be patterned by utilizing its photosensitivity.

Figure 7D:
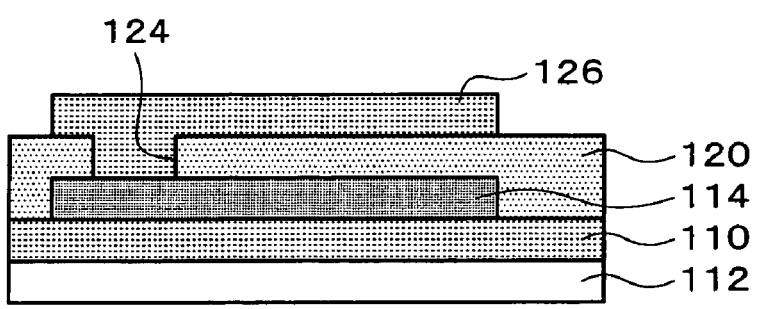

As shown in FIG. 7D, a second interconnecting layer 126 is formed on the second receiving layer 120. The second interconnecting layer 126 is formed by using a dispersion liquid containing conductive particles. The description of the first interconnecting layer 114 may be applied to the material and the formation method for the second interconnecting layer 126. The second interconnecting layer 126 is formed to come in contact with the first interconnecting layer 114 through the contact hole 124. In the case of forming the second interconnecting layer 126 by using a dispersion liquid containing conductive particles, the dispersion liquid may be into the contact hole 124.

Figure 8A:
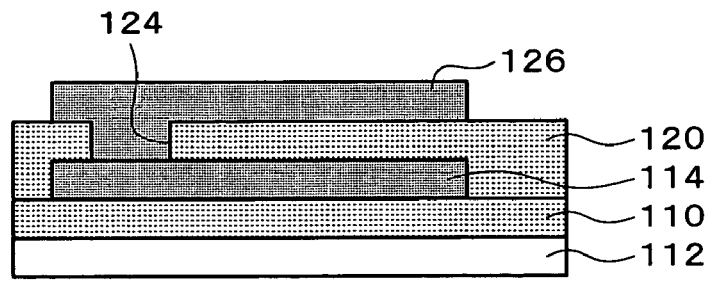
FIGS. 8A to 8C are illustrative of a method of manufacturing a wiring board according to the fourth embodiment of the present invention.

As shown in FIG. 8A, the second interconnecting layer 126 may be heated at a temperature lower than the temperature at which the thermosetting resin precursors which make up the first and second receiving layers 110 and 120 are heat-cured (about 200° C., for example). The coating material which covers the conductive particles may be decomposed by this heating. A gas may be generated when decomposing the coating material.

Figure 8B:
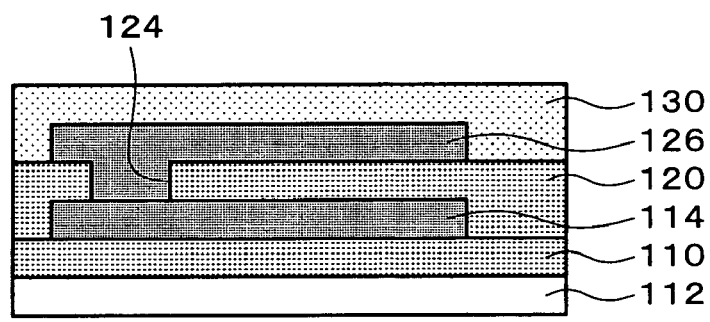

As shown in FIG. 8B, a third receiving layer 130 may be formed on the second interconnecting layer 126 and the second receiving layer 120. The third receiving layer 130 is formed by using a thermosetting resin precursor. The description of the first receiving layer 110 may be applied to the material and the formation method for the third receiving layer 130. The third receiving layer 130 may exhibit photosensitivity before being cured. The third receiving layer 130 has insulating properties and may be called a third insulating layer.

Figure 8C:
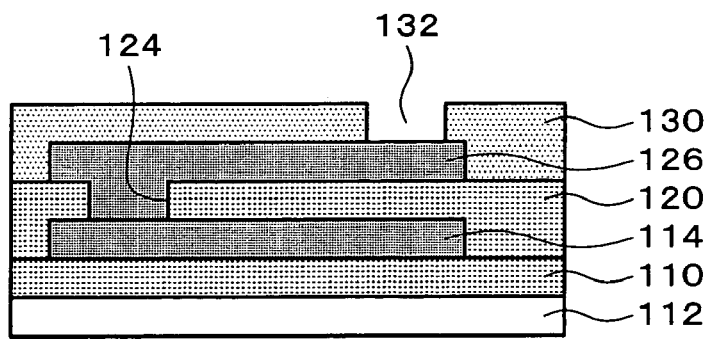
Figure 9A:
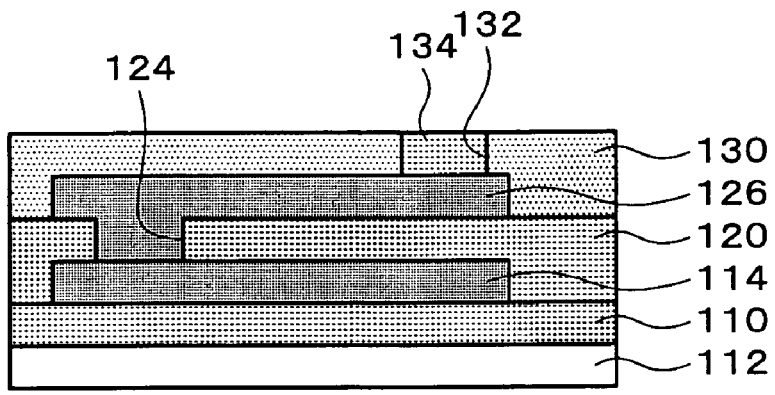
FIGS. 9A to 9C are illustrative of a method of manufacturing a wiring board according to the fourth embodiment of the present invention.

As shown in FIG. 8C, a contact hole 132 may be formed in the third receiving layer 130. The formation method for the contact hole 124 in the second receiving layer 120 may be applied to the formation method for the contact hole 132. As shown in FIG. 9A, a contact post 134 may be formed in the contact hole 132. The material and the formation method for the first interconnecting layer 114 may be applied to the material and the formation method for the contact post 134.

Heat is applied to the first and second receiving layers 110 and 120. The first and second receiving layers 110 and 120 may be heated at a temperature at which the thermosetting resin precursors which make up the first and second receiving layers 110 and 120 are heat-cured (polymerized, for example) (about 300 to 400° C., for example). This causes the thermosetting resin precursor to become an insoluble and infusible resin (thermosetting resin). For example, a polyimide precursor becomes a polyimide, and an epoxy resin precursor becomes an epoxy resin. The first and second receiving layers 110 and 120 are cured and strongly bonded.

Figure 9B:
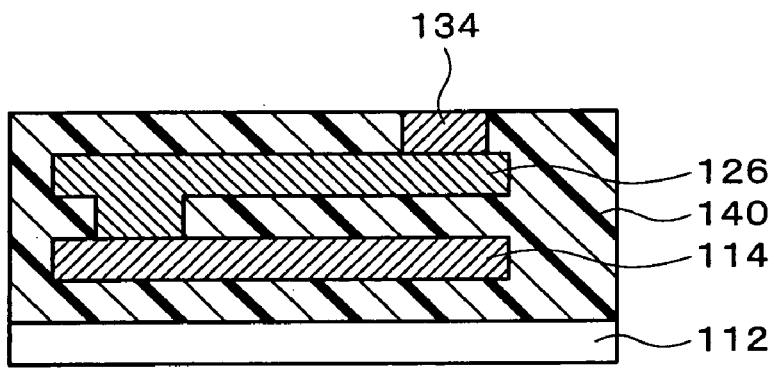

As shown in FIG. 9B, the first and second receiving layers 110 and 120 (and the third receiving layer 130) may be integrally heat-cured to form an integral insulating layer 140. This prevents occurrence of interlayer separation between the first and second receiving layers 110 and 120 (and the third receiving layer 130).

The first and second receiving layers 110 and 120 may be heated at a temperature at which the conductive particles are bonded (sintered, for example) in the continuous section of the first and second interconnecting layers 114 and 126 (about 300 to 600° C., for example). The heat may be applied for about one hour. The conductive particles form a conductive film or a conductive layer. After the thermosetting resin precursors are cured and the conductive particles are bonded, the first and second interconnecting layers 114 and 126 have high adhesion to the insulating layer 140 (adhesion between the first interconnecting layer 114 and the first and second receiving layers 110 and 120, or adhesion between the second interconnecting layer 126 and the second and third receiving layers 120 and 130, in more detail), whereby a highly reliable wiring board (multilayered wiring board) is obtained. The conductive particles in the contact post 134 may be bonded (sintered, for example) in the same manner as described above.

Figure 9C:
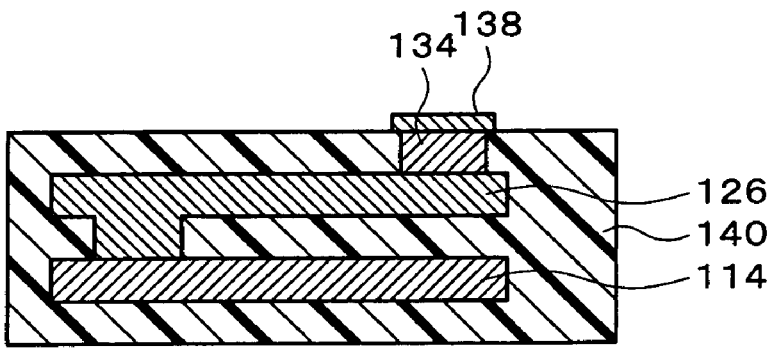

As shown in FIG. 9C, a terminal section 138 may be formed on the contact post 136. The terminal section 138 may be formed to be larger than the upper surface of the contact post 136. In this case, the peripheral section of the terminal section 138 may be placed on the insulating layer 140 (or the third receiving layer 130). The terminal section 138 may be formed by electroless plating of Ni, Cu, or the like.

As shown in FIG. 9C, the base material 112 may be removed from the first receiving layer 110. For example, a copper plate may be used as the base material 112, and the base material 112 may be dissolved by immersing the base material 112 in an etchant such as ferric chloride. This step is performed after causing the thermosetting resin precursors (first, second, and third receiving layers 110, 120, and 130) to be cured and the conductive particles (continuous section of the first and second interconnecting layers 114 and 126) to be bonded.

According to the present embodiment, the first and second interconnecting layers 114 and 126 have high adhesion to the insulating layer 140. Therefore, a highly reliable wiring board (multilayered wiring board) can be easily manufactured.

Fifth Embodiment

Figure 10A:
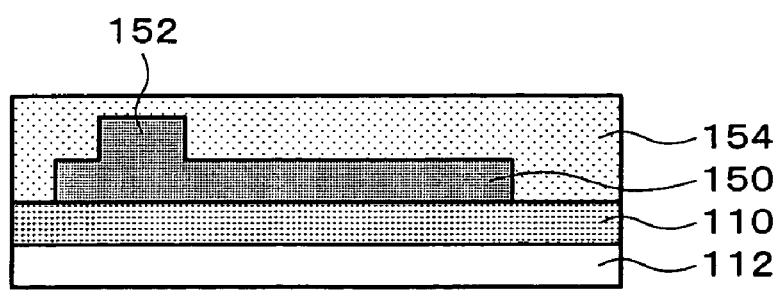
FIGS. 10A and 10B are illustrative of a method of manufacturing a wiring board according to a fifth embodiment of the present invention.
Figure 10B:
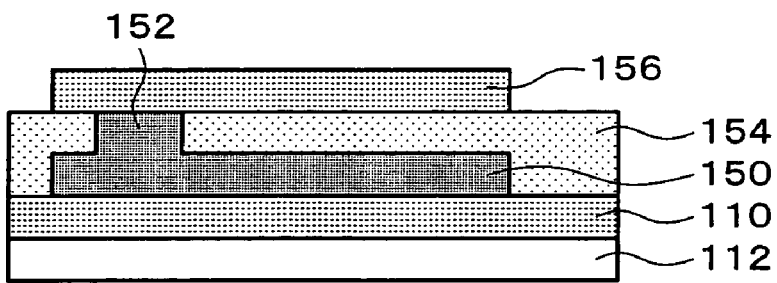

FIGS. 10A and 10B are illustrative of a method of manufacturing a wiring board (multilayered wiring board) according to a fifth embodiment of the present invention. In the present embodiment, a first interconnecting layer 150 is formed on the first receiving layer 110. The base material 112 may be used. The first interconnecting layer 150 is formed to include a contact post 152. The first interconnecting layer 150 may be heated at a temperature lower than the temperature at which the thermosetting resin precursor which makes up the first receiving layer 110 is heat-cured (about 200° C., for example). The coating material which covers the conductive particles may be decomposed by this heating. A gas may be generated when decomposing the coating material.

A second receiving layer 154 is formed on the first interconnecting layer 150 and the first receiving layer 110. The second receiving layer 154 may cover the contact post 152. The description of the second receiving layer 120 in the fourth embodiment may be applied to the material and the formation method for the second receiving layer 154.

At least the upper surface of the contact post 152 is exposed from the second receiving layer 154. The surface of the second receiving layer 154 may be removed so that the second receiving layer 154 becomes thinner. The surface of the second receiving layer 154 may be dissolved.

As shown in FIG. 10B, a second interconnecting layer 156 is formed on the second receiving layer 154. The description of the second interconnecting layer 126 in the fourth embodiment may be applied to the material and the formation method for the second interconnecting layer 156. The second interconnecting layer 156 is formed to pass over the contact post 152.

The thermosetting resin precursors of the first and second receiving layers 110 and 154 are cured and the conductive particles are bonded in the continuous section of the first and second interconnecting layers 150 and 156 by applying heat. A wiring board (multilayered wiring board) can be manufactured in this manner. The description of the fourth embodiment may be applied to the present embodiment. In the present embodiment, the effects described in the fourth embodiment can also be achieved.

Sixth Embodiment

Figure 11A:
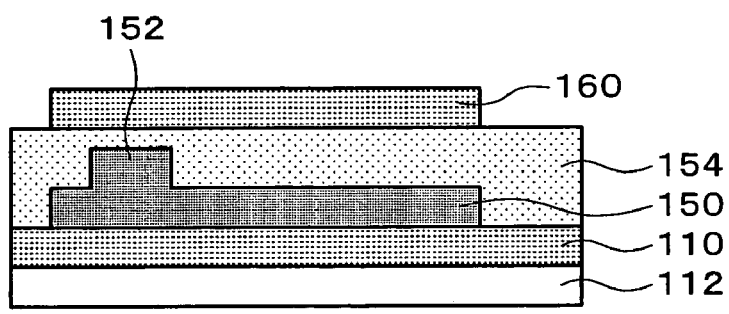
FIGS. 11A and 11B are illustrative of a method of manufacturing a wiring board according to a sixth embodiment of the present invention.
Figure 11B:
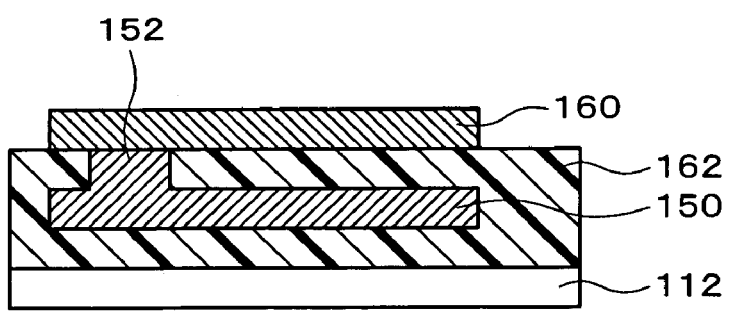

FIGS. 11A and 11B are illustrative of a method of manufacturing a wiring board (multilayered wiring board) according to a sixth embodiment of the present invention. In the present embodiment, the first interconnecting layer 150 is formed on the first receiving layer 110, and the second receiving layer 154 is formed on the first interconnecting layer 150 in the same manner as described in the fifth embodiment. The second receiving layer 154 is formed to cover the contact post 152. The other details are the same as the details described with reference to FIG. 10A.

As shown in FIG. 11A, a second interconnecting layer 160 is formed on the second receiving layer 154 before heat-curing the thermosetting resin precursor which makes up the second receiving layer 154. The description of the second interconnecting layer 126 in the fourth embodiment may be applied to the material and the formation method for the second interconnecting layer 160. A part of the second receiving layer 154 is present between the second interconnecting layer 160 and the contact post 152.

As shown in FIG. 11B, the thermosetting resin precursors of the first and second receiving layers 110 and 154 are cured by applying heat. The first and second receiving layers 110 and 154 may form an integral insulating layer 162. The conductive particles are bonded in the continuous section of the first and second interconnecting layers 150 and 160 by applying heat.

In the present embodiment, the second receiving layer 154 is removed from the space between the contact post 152 and the second interconnecting layer 160 by causing the second receiving layer 154 to shrink during heat-curing (polymerization). The contact post 152 is electrically connected with the second interconnecting layer 160. A wiring board (multilayered wiring board) is manufactured in this manner. The description of the fourth embodiment may be applied to the present embodiment. In the present embodiment, the effects described in the fourth embodiment can also be achieved.

Figure 12:
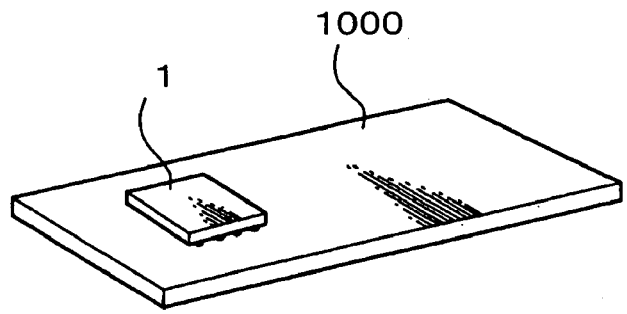
FIG. 12 shows a semiconductor device according to one embodiment of the present invention.
Figure 13:
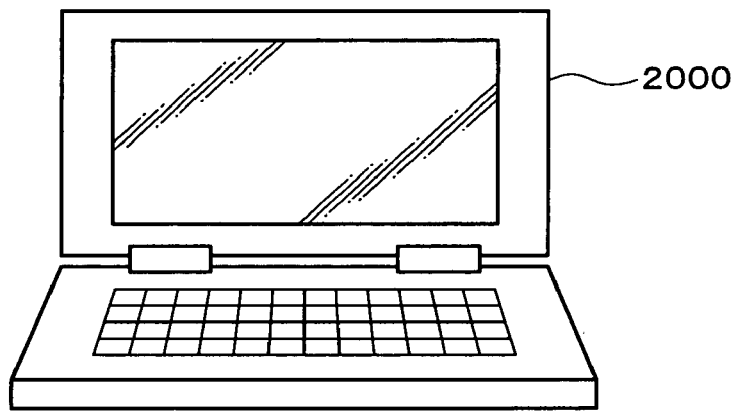
FIG. 13 shows an electronic instrument including a semiconductor device according to an embodiment of the present invention.
Figure 14:
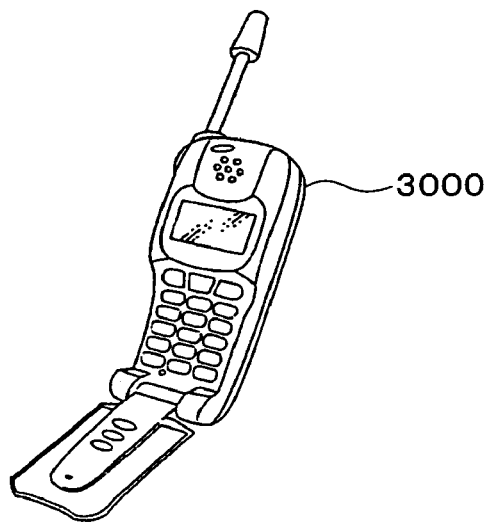
FIG. 14 shows an electronic instrument including a semiconductor device according to an embodiment of the present invention.

FIG. 12 shows a semiconductor device which includes a wiring board 1000 (or multilayered wiring board) described in one of the above embodiments, and a semiconductor chip 1 electrically connected with the wiring board 1000. FIGS. 13 and 14 respectively show a notebook-type personal computer 2000 and a portable telephone 3000 as examples of electronic instruments including the semiconductor device.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A method of manufacturing a wiring board, comprising:
   forming on a base material a receiving layer from a thermosetting resin precursor;
   forming an interconnecting layer on the receiving layer from a dispersion liquid containing conductive particles;
   applying heat to the receiving layer and the interconnecting layer to cure the thermosetting resin precursor and to bond the conductive particles together; and
   removing the base material from the receiving layer after curing of the thermosetting resin precursor and bonding of the conductive particles.

2. A method of manufacturing a wiring board, comprising:
   forming on a base material a first receiving layer from a thermosetting resin precursor;

forming a first interconnecting layer on the first receiving layer from a dispersion liquid containing conductive particles;

forming a second receiving layer on the first receiving layer and the first interconnecting layer from a thermosetting resin precursor;

forming a second interconnecting layer on the second receiving layer from a dispersion liquid containing conductive particles;

applying heat to cure the thermosetting resin precursors of the first and second receiving layers and to bond the conductive particles of the first and second interconnecting layers together at a connecting portion of the first and second interconnecting layers; and removing the base material from the first receiving layer after curing the thermosetting resin precursors of the first and second receiving layers and bonding of the conductive particles of the first and second interconnecting layers at a connecting portion of the first and second interconnecting layers.

* * * * *